United States Patent
Jang

(10) Patent No.: US 8,129,809 B2
(45) Date of Patent: Mar. 6, 2012

(54) IMAGE SENSOR AND MANUFACTURING METHOD THEREOF

(75) Inventor: Hoon Jang, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 45 days.

(21) Appl. No.: 12/638,157

(22) Filed: Dec. 15, 2009

(65) Prior Publication Data

US 2010/0155868 A1    Jun. 24, 2010

(30) Foreign Application Priority Data

Dec. 24, 2008 (KR) .................. 10-2008-0133073

(51) Int. Cl.
*H01L 32/0232* (2006.01)

(52) U.S. Cl. ........ 257/436; 257/435; 257/440; 257/446; 257/E31.122

(58) Field of Classification Search .................. 257/297, 257/435, 440, 443, 445, E31.121, E31.122, 257/E31.123, 436, 446

See application file for complete search history.

(56) References Cited

U.S. PATENT DOCUMENTS

| 7,315,014 | B2 * | 1/2008 | Lee et al. ................. 250/208.1 |
| 7,675,023 | B2 * | 3/2010 | Kim .......................... 250/226 |
| 7,868,366 | B2 * | 1/2011 | Lee ............................ 257/292 |
| 7,897,303 | B2 * | 3/2011 | Rudin et al. .................. 430/7 |
| 2006/0138498 | A1 * | 6/2006 | Kim .......................... 257/294 |
| 2006/0146161 | A1 * | 7/2006 | Farrier ...................... 348/308 |
| 2006/0231898 | A1 * | 10/2006 | Jeong et al. .................. 257/359 |
| 2006/0292731 | A1 * | 12/2006 | Kim ............................. 438/57 |
| 2007/0045513 | A1 * | 3/2007 | Lee et al. ................. 250/208.1 |
| 2007/0117253 | A1 * | 5/2007 | Hsu et al. ..................... 438/75 |
| 2007/0145425 | A1 * | 6/2007 | Woo ........................... 257/233 |
| 2007/0145439 | A1 * | 6/2007 | Han ............................ 257/291 |
| 2007/0148846 | A1 * | 6/2007 | Hyun ......................... 438/199 |
| 2007/0152250 | A1 * | 7/2007 | Kim ............................ 257/292 |
| 2007/0194397 | A1 * | 8/2007 | Adkisson et al. ........... 257/432 |
| 2007/0262354 | A1 * | 11/2007 | Hsu et al. ................... 257/228 |
| 2007/0262364 | A1 * | 11/2007 | Hsu et al. ................... 257/291 |
| 2008/0061330 | A1 * | 3/2008 | Shiau et al. ................. 257/294 |
| 2008/0083939 | A1 * | 4/2008 | Guidash ..................... 257/292 |
| 2008/0150057 | A1 * | 6/2008 | Lee et al. ................... 257/432 |
| 2008/0150059 | A1 * | 6/2008 | Yun ............................ 257/432 |
| 2008/0157247 | A1 * | 7/2008 | Yun ............................ 257/432 |
| 2008/0203452 | A1 * | 8/2008 | Moon et al. ................. 257/292 |
| 2008/0224246 | A1 * | 9/2008 | Lee ............................. 257/432 |
| 2009/0057725 | A1 * | 3/2009 | Kim ............................ 257/252 |
| 2009/0090937 | A1 * | 4/2009 | Park ............................ 257/252 |
| 2009/0090944 | A1 * | 4/2009 | Park ............................ 257/292 |
| 2009/0090989 | A1 * | 4/2009 | Han ............................ 257/432 |
| 2009/0101950 | A1 * | 4/2009 | Hwang ........................ 257/292 |
| 2009/0114960 | A1 * | 5/2009 | Kim et al. ................... 257/292 |
| 2009/0140361 | A1 * | 6/2009 | Jeong ........................... 257/432 |
| 2009/0197365 | A1 * | 8/2009 | Kim et al. ..................... 438/70 |
| 2009/0200631 | A1 * | 8/2009 | Tai et al. ...................... 257/435 |

(Continued)

*Primary Examiner* — David Vu
*Assistant Examiner* — Earl Taylor
(74) *Attorney, Agent, or Firm* — Saliwanchik, Lloyd & Eisenschenk

(57) ABSTRACT

Disclosed are an image sensor and a manufacturing method thereof. The image sensor includes a circuit layer on a first surface of a semiconductor substrate, a metal interconnection layer on the circuit layer, trenches formed in a second surface of the semiconductor substrate along a boundary of a pixel, and a light blocking layer in the trenches. The backside illumination type image sensor according to the embodiment has a light blocking structure at a rear surface of the semiconductor substrate, thereby improving sensing efficiency while inhibiting interference between adjacent pixels.

7 Claims, 6 Drawing Sheets

U.S. PATENT DOCUMENTS

2009/0302409 A1* 12/2009 Qian et al. .................. 257/437
2010/0006963 A1* 1/2010 Brady .......................... 257/432
2010/0038523 A1* 2/2010 Venezia et al. ............... 250/216
2010/0051785 A1* 3/2010 Dai et al. .................... 250/208.1
2010/0084692 A1* 4/2010 Mao et al. .................... 257/258
2010/0155868 A1* 6/2010 Jang ............................. 257/432

* cited by examiner

IMAGE SENSOR AND MANUFACTURING METHOD THEREOF

CROSS-REFERENCE TO RELATED APPLICATION

This application claims the benefit under 35 U.S.C. §119 of Korean Patent Application No. 10-2008-0133073, filed Dec. 24, 2008, which is hereby incorporated by reference in its entirety.

BACKGROUND

Recently, CMOS (Complementary Metal Oxide Semiconductor) image sensors are spotlighted as next-generation image sensors. The CMOS image sensor is a device employing a switching mode to sequentially detect an output of each unit pixel by means of MOS transistors, in which the MOS transistors are formed on a semiconductor substrate corresponding to the unit pixels through a CMOS technology using peripheral devices, such as a controller and a signal processor. The CMOS image sensor includes a photodiode and the MOS transistor in each unit pixel, and sequentially detects electric signals of each unit pixel in a switching mode to realize images.

Since the CMOS image sensor is manufactured by utilizing the CMOS technique, it has an advantage of low power consumption. In addition, since a smaller number of photo-processing steps are required, the manufacturing process of the CMOS image sensor can be simplified, Further, since a controller, a signal processor, an analog/digital converter, and the like can be integrated on a CMOS image sensor chip, the CMOS image sensor can minimize the size of a product. Accordingly, the CMOS image sensor is widely applied to various application fields, such as a digital still camera and a digital video camera.

BRIEF SUMMARY

An embodiment provides an image sensor and a manufacturing method thereof, capable of improving sensing efficiency while inhibiting adjacent pixels from interfering with each other.

An image sensor according to an embodiment includes a circuit layer on a first surface of a semiconductor substrate, a metal interconnection layer on the circuit layer, trenches formed in a second surface of the semiconductor substrate along a boundary of a pixel, and a light blocking layer in the trenches.

A method of manufacturing an image sensor according to an embodiment includes forming a circuit layer on a first surface of a semiconductor substrate, forming a metal interconnection layer on the circuit layer, forming trenches in a second surface of the semiconductor substrate along a boundary of a pixel, and forming a light blocking layer by filling the trenches with a metal layer.

An image sensor according to another embodiment includes a circuit layer on a first surface of a semiconductor substrate, a metal interconnection layer on the circuit layer, trenches formed in a second surface of the semiconductor substrate along a boundary of a pixel, a color filter layer having first, second, and third color filters formed on the second surface of the semiconductor substrate corresponding to pixels, and a light blocking layer obtained by filling material of the first color filter in the trenches.

A method of manufacturing an image sensor according to another embodiment includes forming a circuit layer on a first surface of a semiconductor substrate, forming a metal interconnection layer on the circuit layer, forming trenches in a second surface of the semiconductor substrate along a boundary of a pixel, forming a first color filter layer on the second surface of the semiconductor substrate, and forming a light blocking layer in the trenches and a first color filter by partially exposing and developing the first color filter layer.

A method of manufacturing an image sensor according to yet another embodiment includes forming a circuit layer on a first surface of a semiconductor substrate, forming a metal interconnection layer on the circuit layer, forming trenches in a second surface of the semiconductor substrate along a boundary of a pixel, forming a first color filter layer on the second surface of the semiconductor substrate, forming a light blocking layer in the trenches by partially exposing and developing the first color filter layer, and forming a color filter layer on the second surface of the semiconductor substrate. The color filter layer includes a first color filter formed using another first color filter layer.

DETAILED DESCRIPTION

Figure 1:
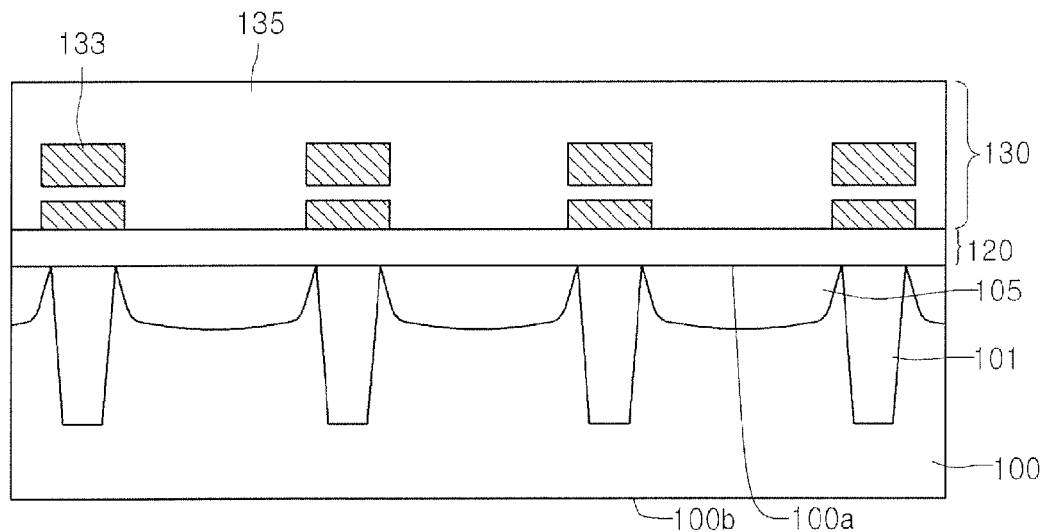
FIGS. 1 to 6 are cross-sectional views showing a manufacturing process for an image sensor according to a first embodiment.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present. The size or thickness of elements or layers shown in the drawings may be magnified, omitted or schematically shown for the purpose of clear explanation and the real size of the elements or the layers may be different from the size of elements shown in drawings.

FIGS. 1 to 6 are cross-sectional views showing a manufacturing process for an image sensor according to a first embodiment.

A pixel of an image sensor includes a photodiode PD for detecting light and a plurality of transistors for controlling transmission and/or output of charges stored in the photodiode PD. According to the present embodiment, the pixel may include, for example, four transistors.

That is, the pixel includes the photodiode for detecting light, a transfer transistor Tx, a reset transistor Rx, a select transistor Sx, and an access transistor Ax.

The photodiode PD is connected to the transfer transistor Tx and the reset transistor Rx in series. A source of the transfer transistor Tx is connected to the photodiode PD, and a drain of the transfer transistor Tx is connected to a source of the reset transistor Rx. A supply voltage Vdd is applied to a drain of the reset transistor Rx.

The drain of the transfer transistor Tx serves as a floating diffusion layer FD. The floating diffusion layer FD is connected to a gate of the access transistor Ax. The access transistor Ax is connected with the select transistor Sx in series. In other words, a source of the access transistor Ax is connected to a source of the select transistor Sx. The supply voltage Vdd is applied to a drain of the access transistor Ax and the drain of the reset transistor Rx. A drain of the select transistor Sx corresponds to an output terminal Out, and a select signal Row is applied to a gate of the select transistor Sx.

Hereinafter, the operation of the pixel of the image sensor having the above structure will be described in brief. After the reset transistor Rx is turned on such that the floating diffusion layer FD has electric potential the same as that of the supply voltage Vdd, the reset transistor Rx is turned off. This operation is called a reset operation.

If external light is incident onto the photodiode PD, electron-hole pairs (EHP) are generated in the photodiode PD so that signal charges are stored in the photodiode PD. Thereafter, as the transfer transistor Tx is turned on, the signal charges stored in the photodiode PD are output to the floating diffusion layer FD and stored in the floating diffusion layer FD. Accordingly, the electric potential of the floating diffusion layer FD is changed proportionally to quantity of the signal charges output from the photodiode PD, so that the electric potential of the gate of the access transistor Ax is changed. In this case, if the select transistor Sx is turned on by the select signal Row, data are output to the output terminal Out. After the data have been output, the pixel carries out the reset operation. The pixel repeats the above operation to convert light into an electric signal and output the electric signal.

Referring to FIG. 1, a semiconductor substrate 100 is prepared. The semiconductor substrate 100 includes a first surface 100a and a second surface 100b opposite to the first surface. The first surface 100a may serve as a top surface and the second surface 100b may serve as a bottom surface.

The semiconductor substrate 100 is formed on the first surface thereof with a light receiving device 105, which is obtained by implanting impurities.

The light receiving device 105 may include a photodiode.

The light receiving device 105 is provided corresponding to each pixel.

The semiconductor substrate 100 includes an isolation layer 101. The isolation layer 101 extends from the first surface 100a towards the second surface 100b of the semiconductor substrate 100. The isolation layer 101 can be formed through an STI process.

The isolation layer 101 defines an active area and a non-active area of the semiconductor substrate 100.

The light receiving device 105 is formed in the active area.

The light receiving device 105 may include an area doped with low-concentration n-type impurities and an area doped with low-concentration p-type impurities to form a PN structure, but the embodiment is not limited thereto.

The semiconductor substrate 100 is provided on the first surface thereof with a circuit layer 120. The circuit layer 120 may include a plurality of transistors.

The transistors may include a transfer transistor, a reset transistor, a drive transistor, and a select transistor.

Each transistor includes a gate, a source and a drain.

For instance, the transfer transistor Tx includes a gate electrode, a spacer and a drain.

The gate electrode is aligned on the semiconductor substrate 100. The gate electrode may include polysilicon or silicide. In addition, a gate insulating layer can be interposed between the gate electrode and the semiconductor substrate 100.

The spacer is aligned at a side of the gate electrode. The drain is formed by implanting low-concentration and high-concentration impurities onto the semiconductor substrate 100 and the drain serves as a floating diffusion layer. The light receiving device 105 is at the source of the transfer transistor Tx.

The circuit layer 120 includes a pre-metallic dielectric (PMD) layer that covers the transistors.

A metal interconnection layer 130 including metal interconnections 133 and insulating layers 135 is formed on the circuit layer 120 such that the metal interconnections 133 can be electrically connected to the circuit layer 120.

The metal interconnection 133 and the insulating layers 135 are repeatedly deposited in such a manner that the metal interconnection 133 can be covered with the insulating layers 135.

Figure 2:
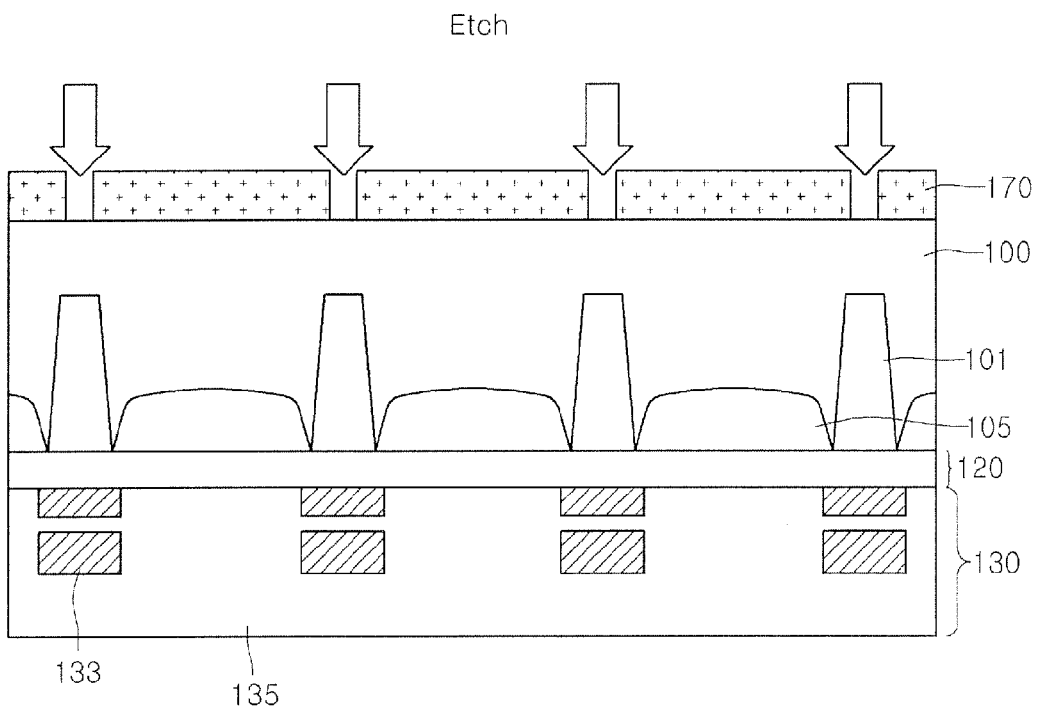

Then, referring to FIG. 2, a photoresist pattern 170 is formed on the second surface 100b of the semiconductor substrate 100.

The semiconductor substrate at the boundary of the pixel is exposed through the photoresist pattern 170.

Figure 3:
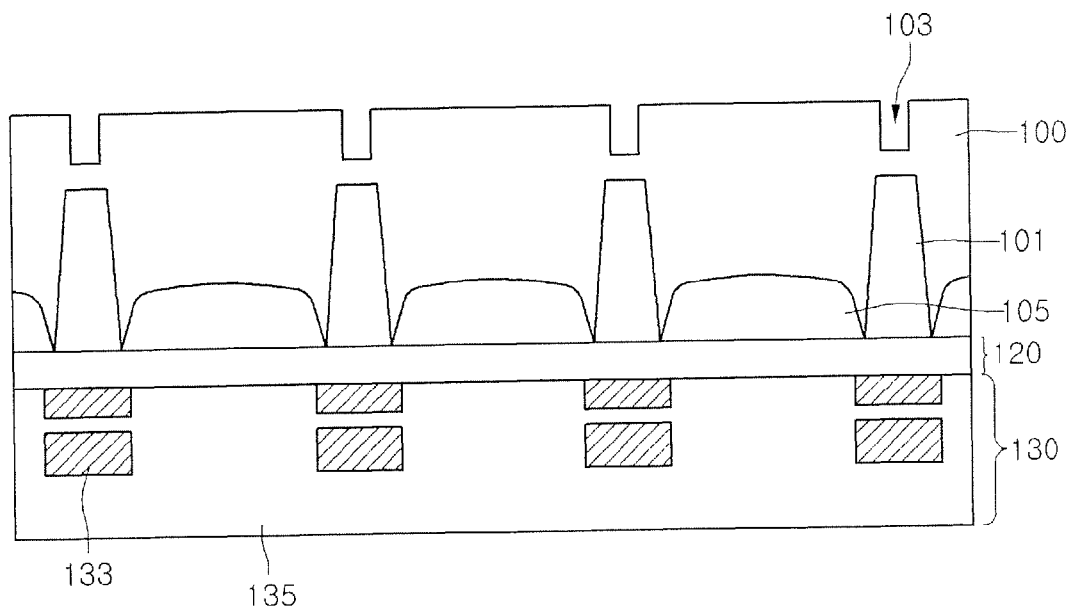

Referring to FIG. 3, the semiconductor substrate 100 is etched by using the photoresist pattern 170 as a mask, thereby forming trenches 103.

The trench 103 may have a depth of about 1~2 μm.

Then, the photoresist pattern 170 is removed.

Accordingly, the trenches 103 having a predetermined depth are formed in the second surface of the semiconductor substrate 100 along the boundary of the pixel.

Figure 4:
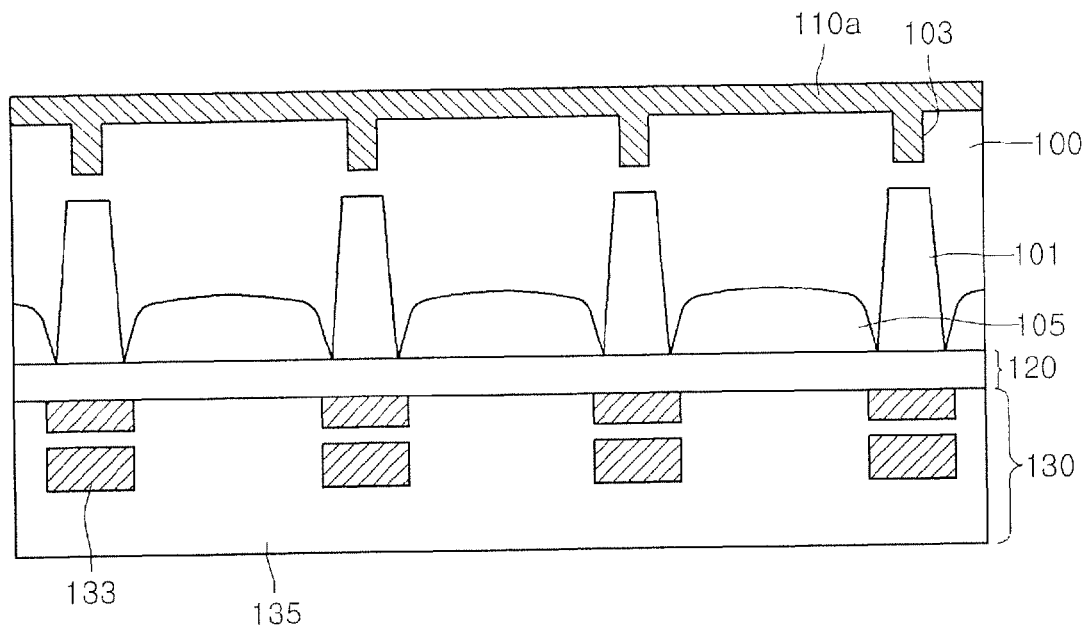

Referring to FIG. 4, a metal layer 110a is deposited on the second surface of the semiconductor substrate 100 having the trenches 103.

The metal layer 110a may include at least one selected from the group consisting of Cu, W, Ti, Ta, Co, Al and Mo.

For instance, the metal layer 110a includes a tungsten (W) layer.

The metal layer 110a is filled in the trenches 103 formed in the semiconductor substrate 100.

Then, the metal layer 110a is polished through a chemical mechanical polishing process, so that the second surface of the semiconductor substrate 100 is exposed.

Figure 5:
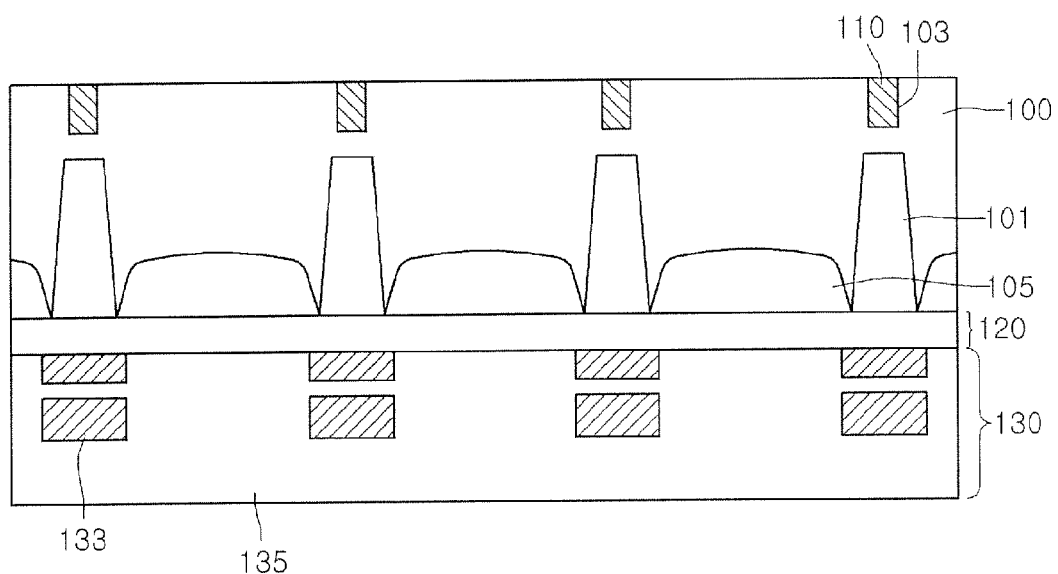

Thus, as shown in FIG. 5, a light blocking layer 110 filled in the trench 103 is formed.

The light blocking layer 110 extends from the second surface towards the first surface of the semiconductor substrate 100.

The light blocking layer 110 is vertically formed while surrounding each pixel, thereby inhibiting light, which is slantingly incident into each pixel, from exerting an influence upon an adjacent pixel.

Figure 6:
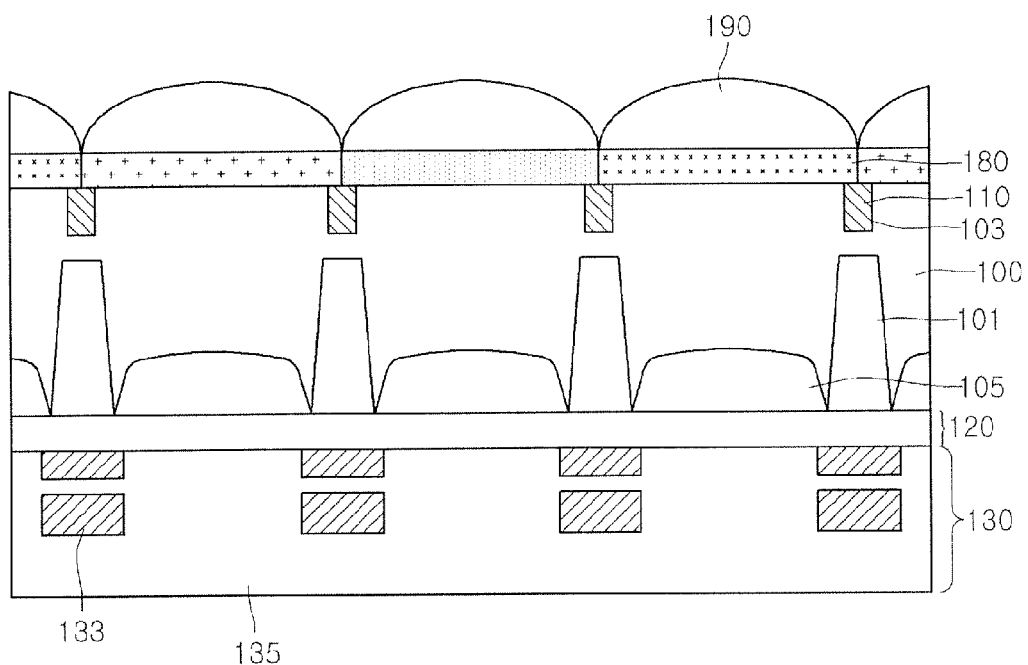

Then, as shown in FIG. 6, a color filter layer 180 is formed over the whole area of the second surface of the semiconductor substrate 100, and a micro-lens 190 is formed on the color filter layer 180.

A protective layer can be interposed between the color filter layer 180 and the second surface of the semiconductor substrate 100.

The color filter layer 180 includes a red color filter, a green color filter and a blue color filter corresponding to the pixels.

The light incident into the micro-lens 190 passes through the color filter layer 180 and then is incident into the light receiving device 105. At this time, the light blocking layer 110 formed at the boundary of the pixel and having a predetermined depth can inhibit the light, which is slantingly incident into the micro-lens 190, from exerting an influence upon an adjacent pixel.

Therefore, the CMOS image sensor in accordance with an embodiment can improve the sensing efficiency while inhibiting adjacent pixels from interfering with each other.

Figure 7:
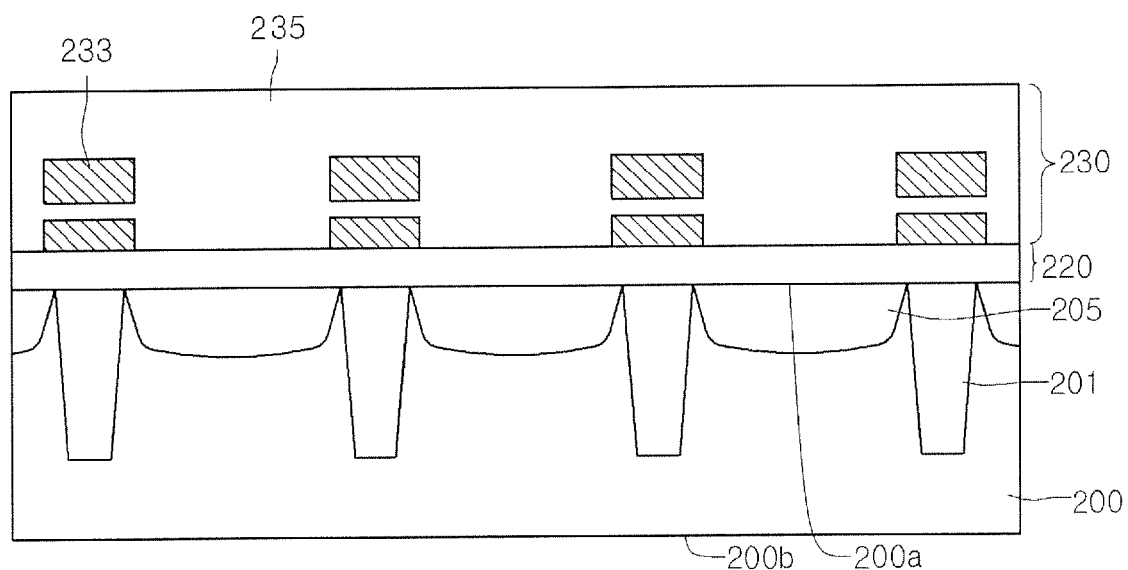
FIGS. 7 to 10 are cross-sectional views showing a manufacturing process for an image sensor according to a second embodiment.

FIGS. 7 to 10 are cross-sectional views showing a manufacturing process for an image sensor according to a second embodiment Referring to FIG. 7, a circuit layer 220 and a metal interconnection layer 230 are formed on the first surface 200a of a semiconductor substrate 200.

The circuit layer 220 and the metal interconnection layer 230 have the structure identical to the structure of the circuit layer and the metal interconnection layer according to the first embodiment, so detailed description thereof will be omitted in order to avoid redundancy.

Figure 8:
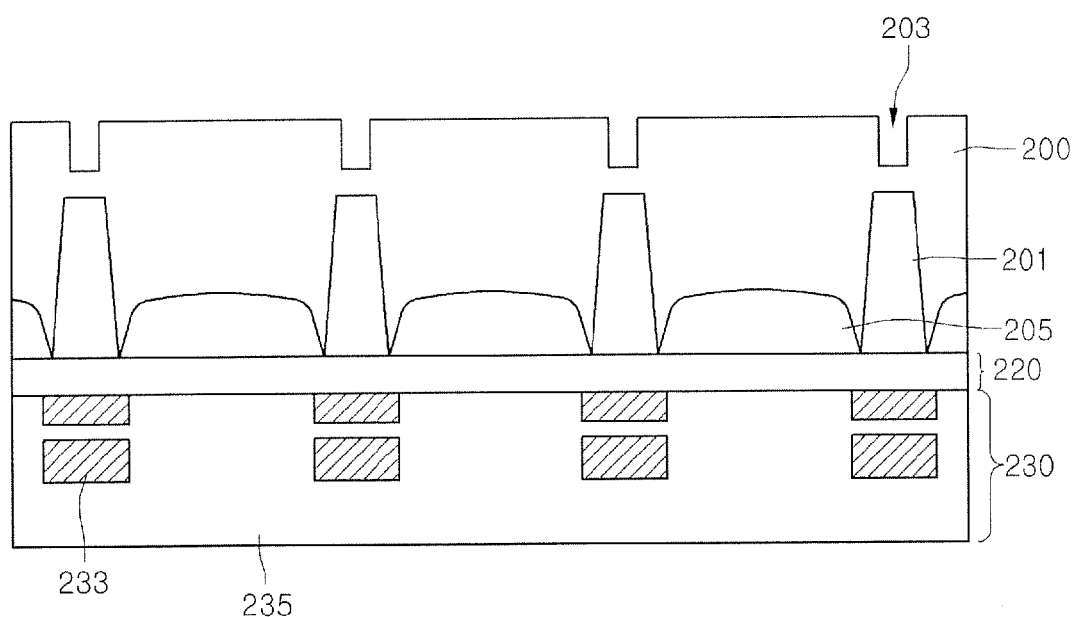

Referring to FIG. 8, a photoresist pattern can be formed on the second surface 200b of the semiconductor substrate 200, and trenches 203 are formed by etching the second surface of the semiconductor substrate 200 by using the photoresist pattern as a mask.

The trenches 203 may have a depth of about 1~2 μm.

The trenches 203 extend from the second surface towards the first surface of the semiconductor substrate 200 along the boundary of a pixel.

Figure 9:
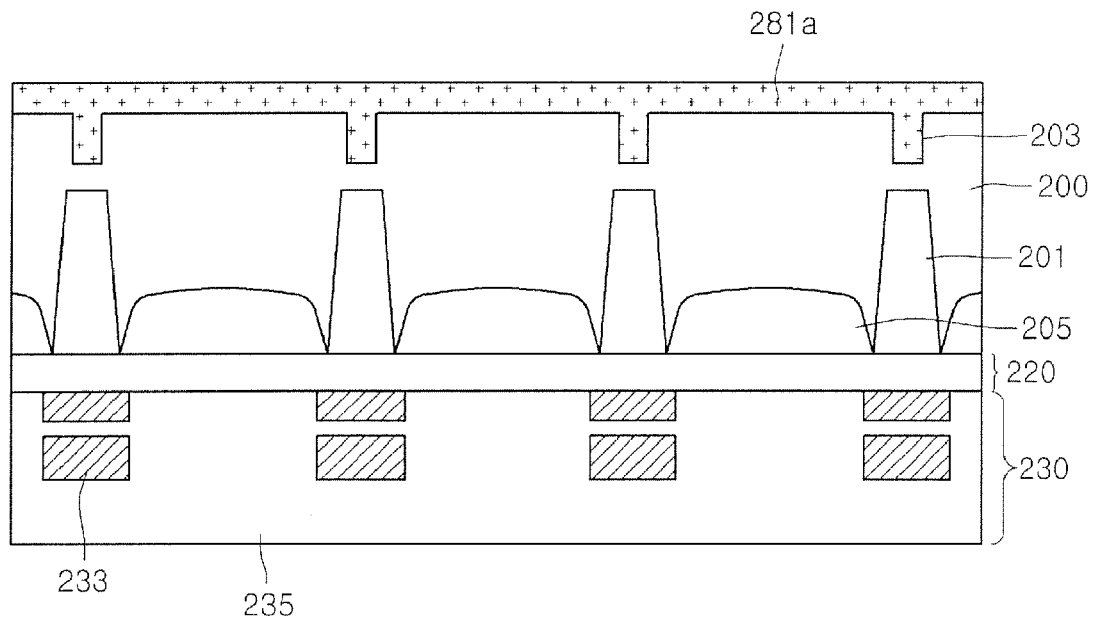

Referring to FIG. 9, blue color filter resin is coated on the second surface of the semiconductor substrate 200 having the trenches, thereby forming a blue color filter layer 281a.

The blue color filter layer 281a is filled in the trenches 203 of the semiconductor substrate 200.

Then, the blue color filter layer 281a is partially exposed and developed, thereby forming a blue color filter 281 and a light blocking layer 281b filled in the trenches 203.

Figure 10:
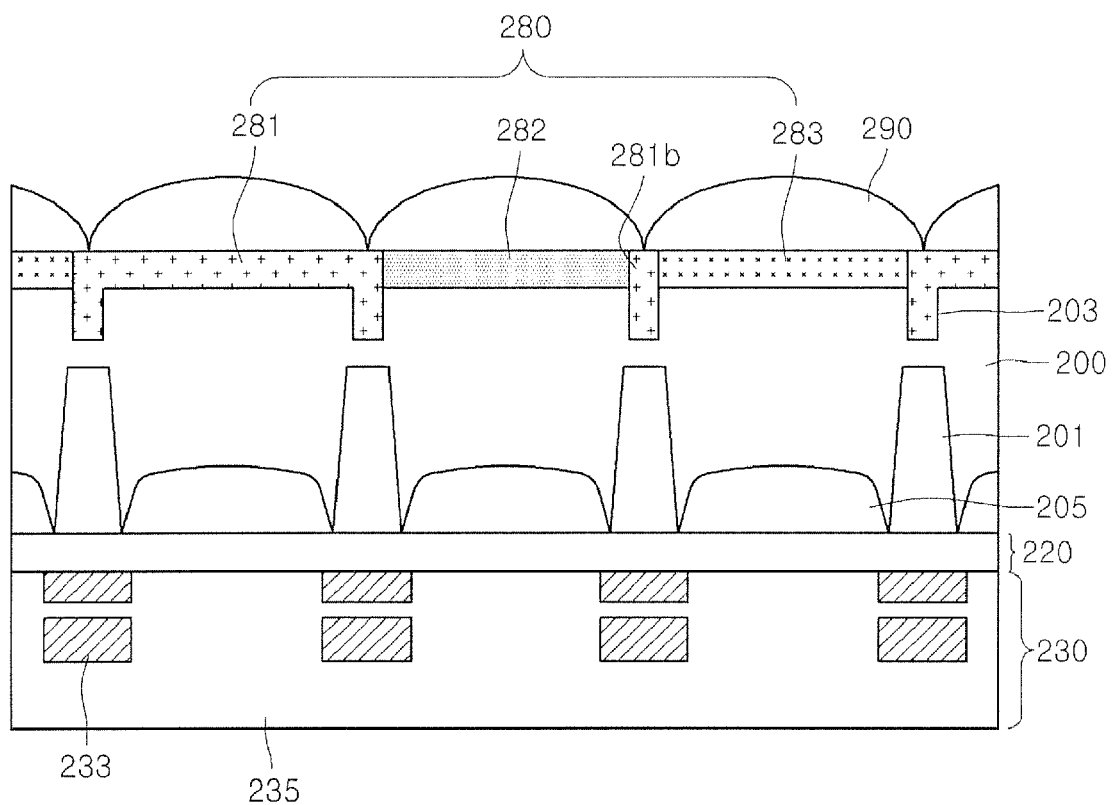

As shown in FIG. 10, a red color filter 282 and a green color filter 283 are formed on the semiconductor substrate 200 having the blue color filter 281, thereby forming a color filter layer 280.

The blue color filter resin filled in the trenches 203 represents low light transmissivity, so that the light, which slantingly incident, can be inhibited from exerting an influence upon an adjacent pixel.

In addition, since the light blocking layer 281b can be formed simultaneously with the blue color filter 281, the manufacturing process can be simplified.

Figure 11:
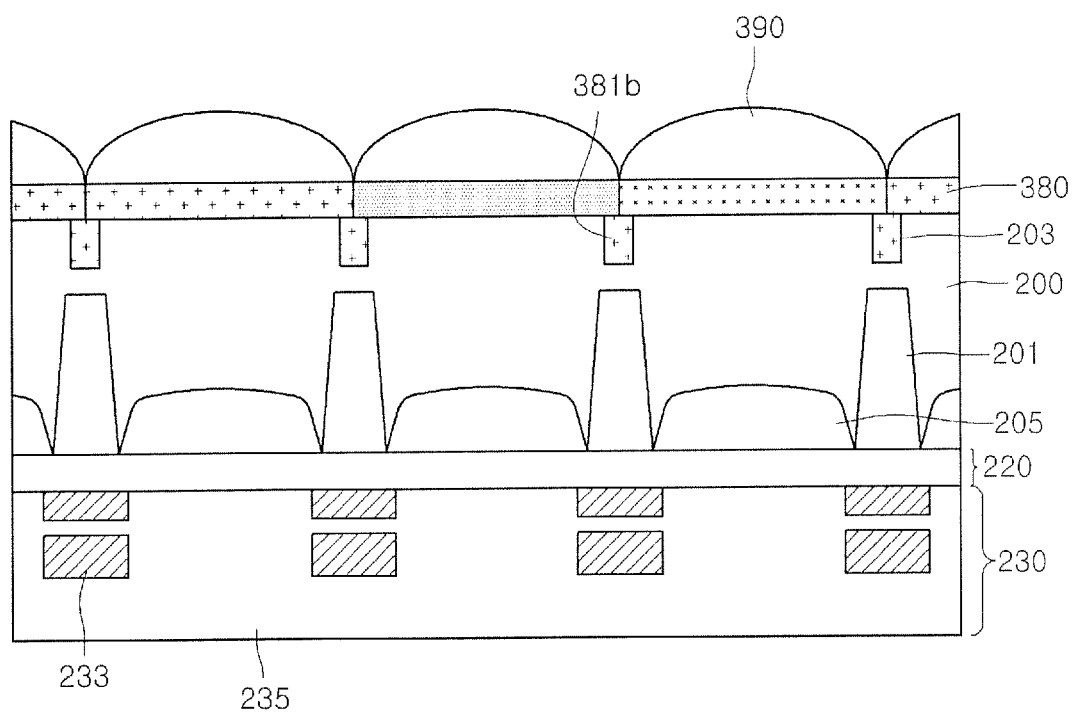
FIG. 11 is a cross-sectional view showing an image sensor according to a third embodiment.

FIG. 11 is a cross-sectional view showing an image sensor according to a third embodiment.

According to the third embodiment, processes identical to those of the second embodiment are performed until the trenches 203 are formed in the semiconductor substrate 200.

The trenches 203 may have a depth of about 1~2 μm.

Blue color filter resin is coated on the second surface of the semiconductor substrate 200 having the trenches 203 such that the blue color filter resin can be filled in the trenches 203.

At this time, the blue color filter resin coated on the second surface 200b (i.e. not within the trenches 203) may be completely removed or may remain at a minimal thickness.

After that, an exposure process is performed by using a mask having openings corresponding to the light blocking layer, and the blue color filter resin remaining at the pixel area, which is not subject to the exposure process, is developed.

Thus, the blue color filter resin may remain only in the trenches 203, so that a light blocking layer 381b can be formed.

Then, a color filter layer 380 is formed over the whole area of the second surface of the semiconductor substrate 200 and a micro-lens 390 is formed on the color filter layer 380.

A protective layer can be interposed between the color filter layer 380 and the second surface of the semiconductor substrate 200.

The color filter layer 380 includes a red color filter, a green color filter and a blue color filter corresponding to the pixels. The blue color filter can be formed separate from the light blocking layer 381b.

The light incident into the micro-lens 390 passes through the color filter layer 380 and then is incident into the photodiode. At this time, the light blocking layer formed at the boundary of the pixel with a predetermined depth can inhibit the light, which is slantingly incident into the micro-lens 390, from exerting an influence upon an adjacent pixel.

Therefore, the CMOS image sensor according to an embodiment can improve the sensing efficiency while inhibiting adjacent pixels from interfering with each other.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An image sensor comprising:
a circuit layer on a first surface of a semiconductor substrate;
a metal interconnection layer on the circuit layer;
trenches formed in a second surface of the semiconductor substrate along a boundary of a pixel;
a first light blocking layer in the trenches;
photodiodes in the first surface of the semiconductor; and
a second light blocking layer,
wherein the second light blocking layer includes an isolation layer extended from the first surface of the semiconductor substrate towards the second surface of the semiconductor substrate, wherein the second light blocking layer is formed between the photodiodes, and
wherein the second light blocking layer vertically overlaps with the first light blocking layer.

2. The image sensor of claim 1, further comprising a color filter layer on the second surface having the first light blocking layer.

3. The image sensor of claim 2, wherein the first light blocking layer is obtained by filling a portion of a first color filter of the color filter layer in the trenches.

4. The image sensor of claim 3, wherein the first color filter includes blue color filter resin.

5. The image sensor of claim 1, wherein the first light blocking layer includes blue color filter resin.

6. The image sensor of claim 1, wherein the first light blocking layer includes at least one selected from the group consisting of Cu, W, Ti, Ta, Co, Al and Mo.

7. The image sensor of claim 1, wherein the trenches have a depth of about 1~2 μm.

* * * * *